(12) United States Patent
Michal et al.

(10) Patent No.: US 12,647,076 B2
(45) Date of Patent: Jun. 2, 2026

(54) TRANSIMPEDANCE AMPLIFIER CIRCUITS AND DEVICES

(71) Applicants: STMicroelectronics (Alps) SAS, Grenoble (FR); STMicroelectronics (Grenoble) SAS, Grenoble (FR)

(72) Inventors: Vratislav Michal, Fontanil-Cornillon (FR); Nicolas Moeneclaey, Vourey (FR); Jean-Luc Patry, Crolles (FR)

(73) Assignees: STMICROELECTRONICS (ALPS) SAS, Grenoble (FR); STMICROELECTRONICS (GRENOBLE) SAS, Grenoble (FR)

( * ) Notice: Subject to any disclaimer, the term of this patent is extended or adjusted under 35 U.S.C. 154(b) by 597 days.

(21) Appl. No.: 18/174,213

(22) Filed: Feb. 24, 2023

(65) Prior Publication Data

US 2023/0291366 A1 Sep. 14, 2023

(30) Foreign Application Priority Data

Mar. 11, 2022 (FR) .................................... 2202126

(51) Int. Cl.
| | |
|---|---|
| *H03F 3/08* | (2006.01) |
| *H03F 1/02* | (2006.01) |
| *H03F 1/26* | (2006.01) |
| *H03F 3/45* | (2006.01) |
| *H03F 3/68* | (2006.01) |

(52) U.S. Cl.
CPC .......... *H03F 3/082* (2013.01); *H03F 1/0283* (2013.01); *H03F 1/26* (2013.01); *H03F 3/45475* (2013.01); *H03F 3/68* (2013.01); *H03F 2200/129* (2013.01)

(58) Field of Classification Search
CPC ........ H03F 3/082; H03F 3/45475; H03F 3/68; H03F 1/0283; H03F 1/26; H03F 3/265; H03F 2200/129
USPC ........................................................ 330/308
See application file for complete search history.

(56) References Cited

U.S. PATENT DOCUMENTS

| | | | |
|---|---|---|---|
| 8,478,138 B2 * | 7/2013 | Sugawara ............ | H04B 10/677 398/208 |
| 11,177,773 B1 | 11/2021 | Nuttgens | |
| 2005/0068109 A1 * | 3/2005 | Ho ......................... | H03F 3/345 330/310 |

(Continued)

FOREIGN PATENT DOCUMENTS

| | | |
|---|---|---|
| CN | 113972896 A | 1/2022 |
| CN | 219718185 U | 9/2023 |

OTHER PUBLICATIONS

Romanova, Agata et al., "A Review of Modern CMOS Transimpedance Amplifiers for OTDR Applications", MDPI electronics, Lithuania, Sep. 22, 2019, 33 pages.

*Primary Examiner* — Andrea Lindgren Baltzell
*Assistant Examiner* — Lance Torbjorn Bartol
(74) *Attorney, Agent, or Firm* — Slater Matsil, LLP

(57) ABSTRACT

The present disclosure relates to a device comprising a first transimpedance amplifier comprising a first amplification stage with a first MOS transistor, a second transimpedance amplifier comprising a second amplification stage with a second MOS transistor, and a current source series-connected with the first and second amplification stages, the current source having a first terminal coupled to the drain of the first MOS transistor and a second terminal coupled to the drain of the second MOS transistor.

20 Claims, 3 Drawing Sheets

(56) References Cited

U.S. PATENT DOCUMENTS

| | | | |
|---|---|---|---|
| 2010/0258729 A1* | 10/2010 | Roxburgh | ............. G08C 23/04 |
| | | | 250/340 |
| 2013/0242283 A1* | 9/2013 | Bailey | ................... G01S 7/4813 |
| | | | 977/734 |
| 2016/0178442 A1 | 6/2016 | Murray | |
| 2016/0352433 A1* | 12/2016 | Nishikawa | .......... H04B 10/697 |
| 2019/0296692 A1 | 9/2019 | Patel et al. | |

* cited by examiner

TRANSIMPEDANCE AMPLIFIER CIRCUITS AND DEVICES

CROSS-REFERENCE TO RELATED APPLICATIONS

This application is a translation of and claims the priority benefit of French patent application no. 22/02126 filed on Mar. 11, 2022, entitled "Transimpedance amplifier," which is hereby incorporated herein by reference to the maximum extent allowable by law.

TECHNICAL FIELD

The present disclosure relates generally to electronic circuits and devices, and, more particularly, to transimpedance amplifier circuits and devices.

BACKGROUND

Many applications use transimpedance amplifiers. This is, for example, the case in electronics circuits for optical communication in which a current delivered by one photodiode is read by a corresponding transimpedance amplifier.

Known transimpedance amplifiers comprise a first stage, also called an input stage, having a current source and a single amplification stage biased by the current source. The amplification stage has an input receiving an input of the transimpedance amplifier and an output coupled to the output of the transimpedance amplifier, directly or, for example, by at least one other stage of the transimpedance amplifier. The amplification stage is, for example, a MOS (Metal Oxide Semiconductor) transistor biased by the current source, the MOS transistor having its gate receiving the input of the transimpedance amplifier, and a drain coupled to the output of the transimpedance amplifier.

However, such known transimpedance amplifiers suffer from various drawbacks such as, for example, a large power consumption and/or large noise and/or bandwidth limitation.

SUMMARY

There is a need to overcome all or part of the drawbacks of known transimpedance amplifiers, for example of known transimpedance amplifiers of the type described above.

One embodiment addresses all or some of the drawbacks of known transimpedance amplifiers, for example of known transimpedance amplifiers of the type described above.

One embodiment provides a device comprising:

a first transimpedance amplifier comprising a first amplification stage with a first MOS transistor, the first MOS transistor having a source connected to a first node configured to receive a first supply potential, a drain coupled to an output of the first transimpedance amplifier and a gate connected to an input of the first transimpedance amplifier;

a second transimpedance amplifier comprising a second amplification stage with a second MOS transistor, the second MOS transistor having a source connected to a second node configured to receive a second supply potential, a drain coupled to an output of the second transimpedance amplifier and a gate connected to an input of the second transimpedance amplifier; and a current source series-connected with the first and second amplification stages between the first and second nodes, the current source having a first terminal coupled to the drain of the first MOS transistor and a second terminal coupled to the drain of the second MOS transistor.

According to one embodiment, the current source is shared by the first and second transimpedance amplifiers.

According to one embodiment, the current source is configured to deliver a bias current to the first and second MOS transistors.

According to one embodiment, no differential pair comprises the first or second MOS transistor.

According to one embodiment:

the first transimpedance amplifier further comprises a first feedback impedance having a first terminal connected to the input of the first transimpedance amplifier and a second terminal connected to the output of the first transimpedance amplifier; and the second transimpedance amplifier further comprises a second feedback impedance having a first terminal connected to the input of the second transimpedance amplifier and a second terminal connected to the output of the second transimpedance amplifier.

According to one embodiment:

the first amplification stage, for example the drain of the first transistor, is connected to the output of the first transimpedance amplifier by a first capacitance; and the second amplification stage, for example the drain of the second transistor, is connected to the output of the second transimpedance amplifier.

According to one embodiment:

the first amplification stage, for example the drain of the first transistor, is coupled to the output of the first transimpedance amplifier by a first gain stage; and the second amplification stage, for example the drain of the second transistor, is coupled to the output of the second transimpedance amplifier by a second gain stage.

According to one embodiment, the first supply potential is higher than the second supply potential.

According to one embodiment, the first MOS transistor is a PMOS transistor, and the second MOS transistor is a NMOS transistor.

According to one embodiment, the device further comprises:

a first photodiode connected to the input of the first transimpedance amplifier; and a second photodiode connected to the input of the second transimpedance amplifier.

According to one embodiment, the first and second photodiodes are configured to receive light having a same wavelength but with different angles of incidence.

According to one embodiment, the first and second photodiodes are configured to belong to different optical channels.

According to one embodiment, the device further comprises:

a photodiode connected between the input of the first transimpedance amplifier and the input of the second transimpedance amplifier; and a capacitive element connected between the input of the first transimpedance amplifier and the first node, or between the input of the second transimpedance amplifier and the second node.

According to one embodiment, the device further comprises a differential amplifier having a first differential input coupled to the output of the first transimpedance amplifier and a second differential input coupled to the output of the second transimpedance amplifier.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Figure 1:
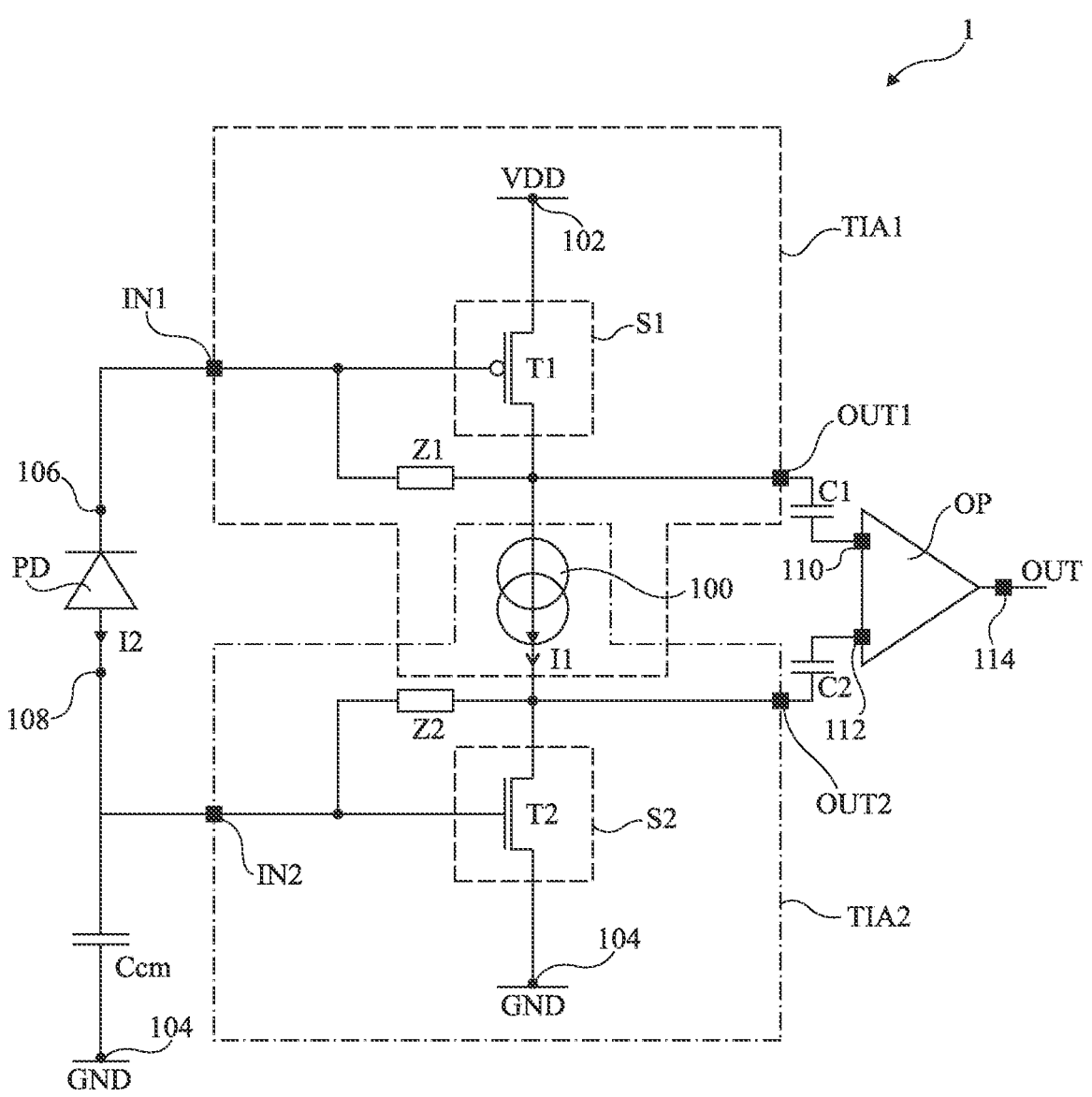
FIG. 1 illustrates one embodiment of a device comprising transimpedance amplifiers.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

It is here proposed to reuse the bias current, or, said in other words, the DC ("Direct Current") current, delivered by a current source for biasing the amplification stage of the input stage of a first transimpedance amplifier, for also biasing the amplification stage of the input stage of a second transimpedance amplifier. Said in other words, it is here proposed to use a shared current source into two transimpedance amplifiers, and, more particularly, into two respective input stages of the transimpedance amplifiers. The amplification stage of each of the first and second transimpedance amplifiers comprises, for example, a MOS transistor having its gate connected to the input of the transimpedance amplifier and a drain coupled to the output of the transimpedance amplifier. The amplification stage of each of the first and second transimpedance amplifiers is, preferably, without any differential pair.

The use by the two transimpedance amplifiers of the DC current delivered by the shared current source allows for reducing the power consumption with respect to a first reference device wherein the shared current source would be replaced by two separated current sources each delivering the same DC current than the shared current source, a first one of the two separated current sources being provided in the a first one of the two transimpedance amplifiers for biasing the input stage of this first amplifier, and a second one of the two separated current sources being provided in the second one of the two transimpedance amplifiers for biasing the input stage of this second amplifier.

According to one embodiment wherein two transimpedance amplifiers share a current source for biasing the amplification stages of their respective input stages, a photodiode is connected between the input of a first one of the two transimpedance amplifiers and the input of the second one of the two transimpedance amplifiers. This allows for reusing the current of the photodiode in both of the two transimpedance amplifiers. This also allows for reading the photodiode in a differential manner, the difference between the outputs of the two transimpedance amplifiers being representative of the current in the photodiode. As a result, the signal to noise ratio, SNR, can be improved by 3 dB with respect to a second device wherein the current in the photodiode is read by only one transimpedance amplifier having the amplification stage of its input stage biased by a DC current equal to the one delivered by the shared current source.

According to an alternative embodiment wherein two transimpedance amplifiers share a current source for biasing the amplification stages of their corresponding input stages, a first photodiode is connected to an input of a first one of the two transimpedance amplifiers, and a second photodiode is connected to an input of a second one of the two transimpedance amplifiers.

According to one embodiment, the two photodiodes belong to a same optical channel, the spatial disposition of the two photodiodes being configured to improve the spatial sensitivity of the optical channel. Said otherwise, the two photodiodes are configured to improve the range of angles of incident of light received by this optical channel, or, said in other words, to improve the radiation diagram aperture of the optical channel.

According to one embodiment, the two photodiodes belong to two different respective optical channels. For example, the spatial disposition of the two photodiodes is configured so that the light received by one of the two photodiodes is different from (or uncorrelated with) the light received by the other one of the two photodiodes and/or one of the two photodiodes is configured to receive light having wavelengths different from those received by the other one of the two photodiodes. As an example, in an application or system where data are transmitted using light, this allows for implementing two independent communications channels.

According to one embodiment, the two transimpedance amplifiers are two capacitive transimpedance amplifiers. According to an alternative embodiment, the transimpedance amplifiers are two resistive transimpedance amplifiers.

FIG. 1 illustrates one embodiment of a device 1 comprising two transimpedance amplifiers TIA1 and TIA2 which share a current source 100 for biasing their input stages.

More particularly, FIG. 1 illustrates one example of an embodiment in which a photodiode PD is connected between the inputs of the amplifiers TIA1 and TIA2.

The amplifier TIA1 is delimited by dotted lines in FIG. 1.

The amplifier TIA1 comprises an amplification stage S1 delimited in dotted lines in FIG. 1. The amplification stage S1 has an input connected to an input IN1 of the amplifier TIA1, an output coupled to an output OUT1 of the amplifier TIA1, and a supply input connected to a node 102 configured to receive a supply potential VDD.

More particularly, the stage S1 is, for example, implemented by a MOS (Metal Oxide Semiconductor) transistor T1. The transistor T1 has a source connected to the node 102, a gate connected to the input IN1, and a drain coupled to the output OUT1.

Figure 2:
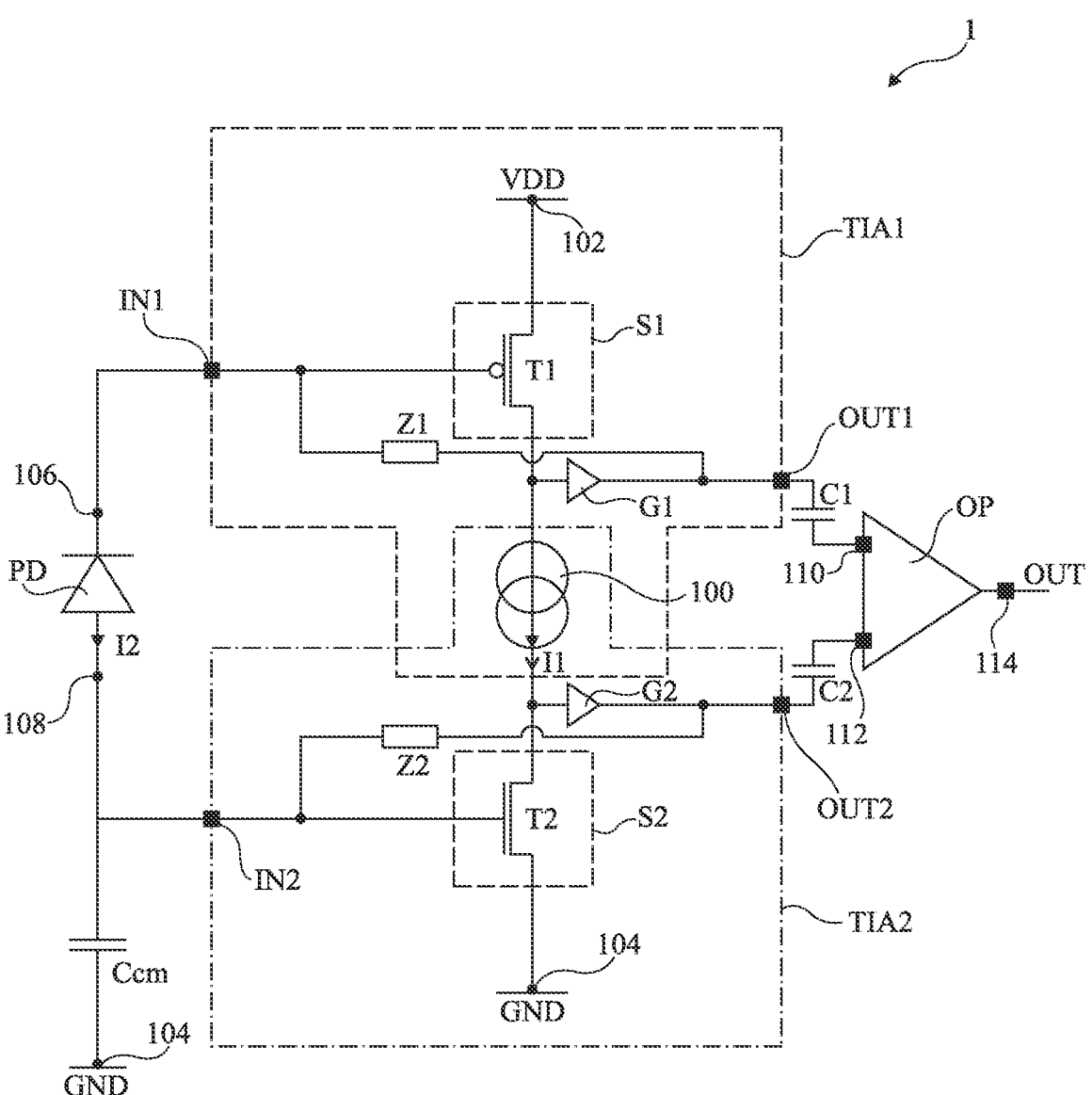
FIG. 2 illustrates an alternative embodiment of the device of FIG. 1.

The amplifier TIA2 is delimited by dotted lines in FIG. 2, the dotted lines delimiting the amplifier TIA2 being different from those delimiting the amplifier TIA1.

The amplifier TIA2 comprises an amplification stage S2 delimited in dotted lines in FIG. 1. The amplification stage S2 has an input connected to an input IN2 of the amplifier TIA2, an output coupled to an output OUT2 of the amplifier TIA2, and a supply input connected to a node 104 configured to receive a supply potential GND.

More particularly, the stage S2 is, for example, implemented by a MOS (Metal Oxide Semiconductor) transistor T2. The transistor T2 has a source connected to the node 104, a gate connected to the input IN2, and a drain coupled to the output OUT2.

Preferably, neither the transistor T1 nor the transistor T2 is part of a differential pair.

According to one embodiment, the potential VDD is higher than the potential GND. For example, the potential GND is a reference potential, for example the ground potential, and the potential VDD is positive with respect to the potential GND.

According to one embodiment where potential VDD is higher than potential GND, the transistor T1 is a PMOS transistor, or, said in other words, a MOS transistor having a P-type channel, the transistor T2 being a NMOS transistor, or, said in other words, a MOS transistor having a N-type channel.

The current source 100 shared by the two amplifiers TIA1 and TIA2 is series-connected with the stages S1 and S2 between the nodes 102 and 104, the current source 100 being connected between the stages S1 and S2. More particularly, the current source 100 is, for example, series-connected with the transistors T1 and T2 between the nodes 102 and 104, the current source 100 being connected between the transistors T1 and T2. For example, the current source 100 has a terminal connected to the stage S1, for example to the drain of transistor T1, and another terminal connected to the stage S2, for example to the drain of transistor T2.

The current source 100 is configured for delivering a biasing current I1 to the amplification stages S1 and S2. The current I1 is a DC current. For example, the current source 100 is configured for delivering the biasing current I1 to the transistors T1 and T2.

Consider a first reference device comprising a first transimpedance amplifier whose input stage has a first amplification stage and a first current source delivering a first current for biasing the first amplification stage, and a second transimpedance amplifier whose input stage has a second amplification stage and a second current source delivering a second current for biasing the second amplification stage, in which each of the first and second amplification stages is similar or identical to the stage S1 of the device 1 and each of the first and second current sources delivers a same current I3.

As the transimpedance amplifiers TIA1 and TIA2 of device 1 share the same current source 100 for biasing their respective amplification stages S1 and S2, current I1 in device 1 can be lower than twice the current I3, which results in less power consumption in the device 1 than in the first reference device.

Referring back to FIG. 1, as it is usual in a transimpedance amplifier, the amplifier TIA1, respectively TIA2, comprises a feedback impedance Z1, respectively Z2.

The impedance Z1 is, for example, identical to the impedance Z2.

Impedances Z1 and Z2 are, for example, resistive elements, for example resistors, the transimpedance amplifiers TIA1 and TIA2 being then resistive transimpedance amplifiers (RTIA). In an alternative example, impedances Z1 and Z2 are, for example, capacitive elements, for example capacitors, the transimpedance amplifiers TIA1 and TIA2 being then capacitive transimpedance amplifiers (CTIA).

The impedance Z1, respectively Z2, couples the input IN1, respectively IN2, to the output OUT1, respectively OUT2. For example, the impedance Z1, respectively Z2, has a terminal connected to the input IN1, respectively IN2, and a terminal connected to the output OUT1, respectively OUT2.

In the example of FIG. 1, the drain of the transistor T1, respectively T2, is connected to the output OUT1, respectively OUT2.

According to one embodiment, as illustrated by FIG. 1, the photodiode PD of device 1 is connected between the inputs IN1 and IN2. For example, the photodiode PD has a terminal 106 connected to input IN1 and a terminal 108 connected to input IN2. For example, when potential VDD is higher than potential GND, terminal 106 corresponds to the cathode of photodiode PD and terminal 108 corresponds to the anode of photodiode PD. The device 1 then further comprises a capacitive element Ccm, for example a capacitor. The capacitive element Ccm is, for example, a common mode capacitive element, or, said in other words, is configured to ensure the stability of the common mode of a differential transimpedance amplifier corresponding to the amplifiers TIA1 and TIA2. Said in other words, the capacitive element Ccm is configured to reduce or avoid common mode oscillations in the differential transimpedance amplifier comprising the transimpedance amplifiers TIA1 and TIA2. For example, the capacitive element Ccm is connected between the input IN2 and node 104. In an alternative example, the capacitive element is connected between input IN1 and node 102.

In embodiments where inputs IN1 and IN2 are coupled together by the photodiode PD, as already indicated before, the amplifiers TIA1 and TIA2 operate in a differential manner, or, said in other words, implements a differential transimpedance amplifier.

Consider a second reference device having only one transimpedance amplifier whose input stage has only one amplification stage similar to stage S1 and a current source delivering the current I1 to this single amplification stage. In embodiments where amplifiers TIA1 and TIA2 operate in differential, the amplifiers TIA1 and TIA2 have uncorrelated noises and their output voltages are in opposite phases. Thus, an output signal (or voltage) between the outputs OUT1 and OUT2 has signal to noise ratio (SNR) which is increased by 3 dB compared to an output signal (or voltage) of the second reference device.

In embodiments where amplifiers TIA1 and TIA2 operate in differential, a photocurrent I2 flowing through photodiode PD is used by both amplifiers TIA1 and TIA2, whereas in the second reference device, the photocurrent is used only once.

In embodiments where amplifiers TIA1 and TIA2 operate in differential, for a given supply voltage between node 102 and 104, the DC bias voltage across the photodiode PD is higher than the DC bias across a similar photodiode being connected to the input of the second reference device supplied by the same given supply voltage. The photodiode PD of device 1 thus has a lower capacitance than the photodiode connected to the second reference device. This is advantageous because decreasing the capacitance of a photodiode allows for improving the signal to noise ratio of an optical receiving chain comprising the photodiode.

In one embodiment where amplifiers TIA1 and TIA2 operate in differential, as illustrated by FIG. 1, the device 1 for example further comprises a differential amplifier OP, for example a differential operational amplifier. Amplifier OP has a differential input 110 coupled to the output OUT1, and a differential input 112 coupled to the output OUT2. For example, output OUT1 is coupled to input 110 by a capacitive element C1, and output OUT2 is coupled to input 112 by a capacitive element C2. The capacitive element C1 is, for example, identical to the capacitive element C2. The capacitive element C1, respectively C2, is, for example, a capacitor.

An output 114 of the amplifier OP then provides an output signal OUT. The output signal OUT is, for example, representative of the current I2 flowing across terminals 106 and 108 of photodiode PD. For example, the amplifiers TIA1, TIA2 and OP implement a readout circuit of the photodiode PD, the readout circuit having the signal OUT as output signal. In an alternative embodiment, the amplifier OP is omitted and the differential signal available between outputs OUT1 and OUT2 is representative of the current I2, and is, for example, an output signal of a readout circuit of the photodiode PD implemented by the amplifiers TIA1 and TIA2.

FIG. 2 illustrates an alternative embodiment of the device 1 of FIG. 1. Device 1 of FIG. 2 is similar to device 1 of FIG. 1, and only the differences between these two devices are here described. In particular, unless specified otherwise, all that have been indicated for the device 1 of FIG. 1 applies to the device 1 of FIG. 2.

The device 1 of FIG. 2 differs from the device 1 of FIG. 1 by the coupling of the output of the amplification stage S1, respectively S2, to the output OUT1, respectively OUT2.

More particularly, in the embodiment of FIG. 2, the output of the stage S1, that is the drain of transistor T1 in this example, is coupled to the output OUT1 by a gain circuit or stage G1, the output of the stage S2, that is the drain of transistor T2 in this example, being coupled to the output OUT2 by a gain circuit or stage G2. The circuit G1 is, for example, identical or similar to the circuit G2.

Although in the example of FIGS. 1 and 2 described above each amplification stage S1, S2 comprises only one MOS transistor, in others examples not shown, each stage S1, S2 is implemented using more than one MOS transistor. For example, each stage S1, S2 is a simple cascode or a regulated cascode. Preferably, even when each amplification stage S1, S2 comprises more than one transistor, each stage S1, S2 does not comprise any differential pair.

Figure 3:
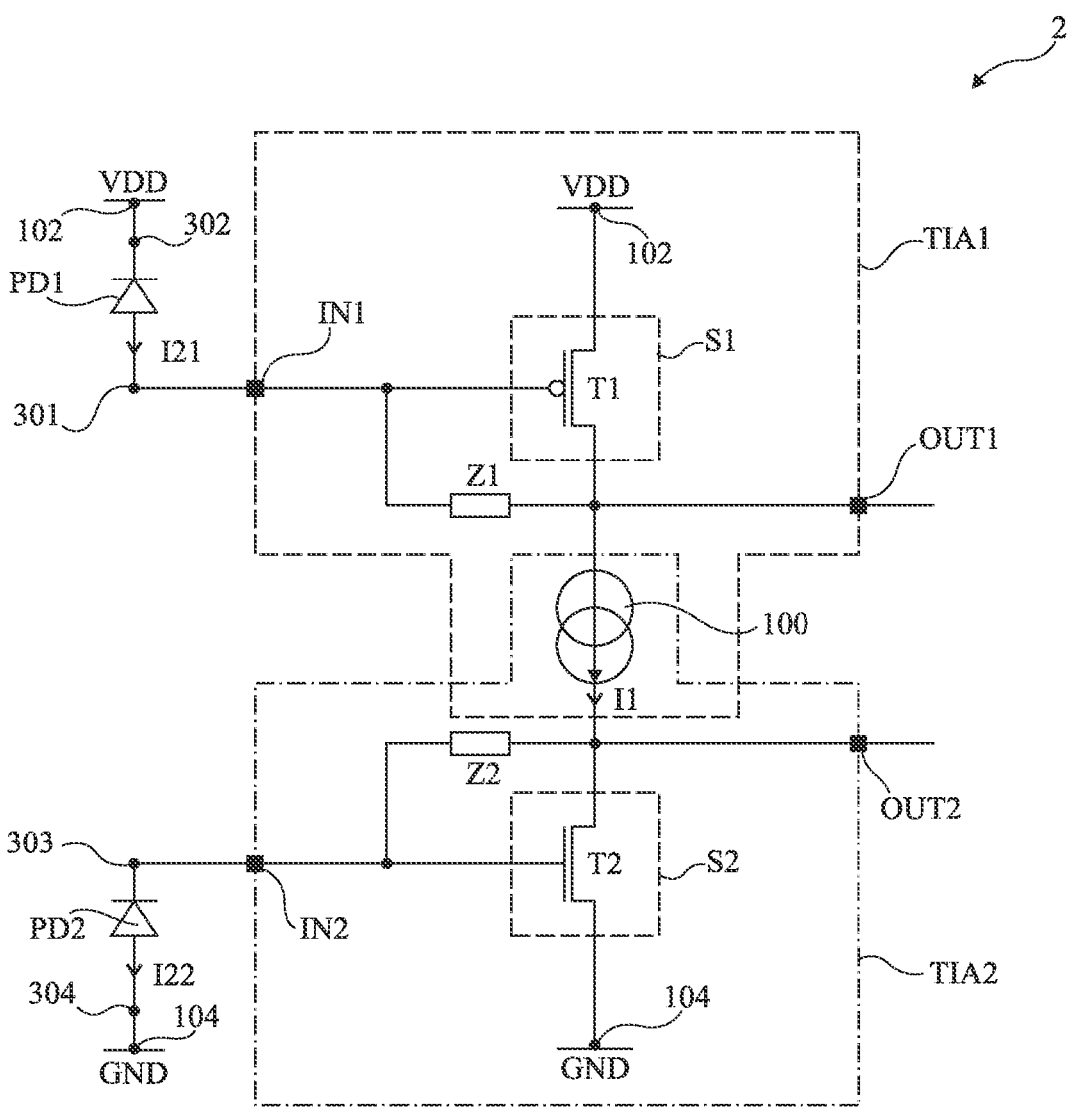
FIG. 3 illustrates one embodiment of a device comprising transimpedance amplifiers.

FIG. 3 illustrates one embodiment of a device 2 comprising two transimpedance amplifiers TIA1 and TIA2.

The amplifiers TIA1 and TIA2 of device 2 are identical to respective amplifiers TIA1 and TIA2 of device 1 of FIG. 1, although, in another example not illustrated, the amplifiers TIA1 and TIA2 of device 2 are identical to respective amplifiers TIA1 and TIA2 of device 1 of FIG. 2. In particular, unless specified otherwise, all that have been indicated for the amplifiers TIA1 and TIA2 in relation with FIG. 1 or FIG. 2 applies to the respective amplifiers TIA1 and TIA2 of device 2.

Device 2 differs from device 1 of FIG. 1 or FIG. 2 by the fact that the photodiode PD is replaced by a photodiode PD1 connected to input IN1 and a photodiode PD2 connected to input IN2, the capacitive element Ccm and the amplifier OP being omitted.

In the example of FIG. 3, the photodiode PD1 is connected between input IN1 and node 102 and the photodiode PD2 is connected between input IN2 and node 104. For example, a terminal 301 of photodiode PD1 is connected to input IN1, a terminal 302 of photodiode PD1 is connected to node 102, a terminal 303 of photodiode PD2 is connected to input IN2 and a terminal 304 of photodiode PD2 is connected to node 104. For example, when potential VDD is higher than potential GND, terminals 301 and 302 respectively correspond to the anode and the cathode of photodiode PD1, terminals 303 and 304 respectively corresponding to the cathode and the anode of photodiode PD2.

In one other example not shown, the photodiode PD1 is connected between input IN1 and node 104 and the photodiode PD2 is connected between input IN2 and node 102. For example, terminal 301 of photodiode PD1 is connected to node 104, terminal 302 of photodiode PD1 is connected to input IN1, terminal 303 of photodiode PD2 is connected to node 102 and terminal 304 of photodiode PD2 is connected to input IN2. For example, when potential VDD is higher than potential GND, terminals 301 and 302 respectively correspond to the anode and the cathode of photodiode PD1, terminals 303 and 304 respectively corresponding to the cathode and the anode of photodiode PD2. Compared to the example represented on FIG. 3, it allows for increasing the DC bias across each photodiode PD1, PD2, thus deceasing the parasitic capacitance of the photodiode.

In device 2, the amplifier TIA1, respectively TIA2, for example implements a readout circuit of the photodiode PD1, respectively PD2. For example, a signal available on output OUT1 is representative of a current I21 flowing across terminals 301 and 302 of photodiode PD1, and a signal available on output OUT2 is representative of a current I22 flowing across terminals 303 and 304 of photodiode PD2.

According to one embodiment, the photodiodes PD1 and PD2 belong to a same optical channel. Said in other words, the photodiodes PD1 and PD2 are configured so that the light received by the photodiode PD1 is correlated to the light received by the photodiode PD2. For example, the photodiodes PD1 and PD2 belong to the same optical channel and are configured to receive light with an angle of incidence which is not the same for the two photodiodes PD1 and PD2. This allows to increase the spatial sensitivity of the optical channel comprising photodiodes PD1 and PD2, or, said in other words, the aperture of the radiation diagram of the optical channel.

For example, the photodiodes PD1 and PD2 are configured to receive light having a same wavelength, the photodiodes being further configured so that the angle of incidence of the light received by the photodiode PD1 is different from the angle of incidence of the light received by the photodiode PD2. For example, the photodiodes PD1 and PD2 are disposed so that the light received by the photodiode PD1 has an angle of incidence different from the one of the light received by the photodiode PD2.

According to an alternative embodiment, photodiodes PD1 and PD2 do not belong to a same optical channel, but, on the contrary, to two separated (or distinct or uncorrelated) optical channels. The two optical channels are separated and/or uncorrelated. Said in other words, the photodiode PD1 is configured to receive light which is uncorrelated with the light the photodiode PD2 is configured to receive. For example, the photodiode PD1 is configured to receive light with wavelength different from the wavelength of the light the photodiode PD2 is configured to receive.

Although not illustrated, one embodiment provides a light sensor having a plurality of devices 1 or 2, the photodiodes of these devices being, for example, organized in a matrix comprising rows and columns of photodiodes.

According to one embodiment, the described devices 1 and 2 are used in an optical communication implemented with the Light Fidelity, or LiFi, technology.

In others embodiments, photodiodes PD, PD1 and PD2 are replaced by other components, for example by resistors for example used for sensing temperature, so that the currents flowing across these other components are read by the amplifiers TIA1 and TIA2.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove. In particular, those skilled in the art are capable of implementing the current source 100, the stages G1 and G2 and the differential amplifier OP.

What is claimed is:

1. A device comprising:
a first transimpedance amplifier comprising:
    a first amplification stage with a first metal-oxide-semiconductor (MOS) transistor, the first MOS transistor having a source connected to a first node configured to receive a first supply potential, a drain coupled to an output of the first transimpedance amplifier, and a gate connected to an input of the first transimpedance amplifier; and
    a first feedback impedance having a first terminal connected to the input of the first transimpedance amplifier and a second terminal connected to the output of the first transimpedance amplifier;
a second transimpedance amplifier comprising:
    a second amplification stage with a second MOS transistor, the second MOS transistor having a source connected to a second node configured to receive a second supply potential, a drain coupled to an output of the second transimpedance amplifier, and a gate connected to an input of the second transimpedance amplifier; and
    a second feedback impedance having a first terminal connected to the input of the second transimpedance amplifier and a second terminal connected to the output of the second transimpedance amplifier; and
a current source series-connected with the first and second amplification stages between the first and second nodes, the current source having a first terminal coupled to the drain of the first MOS transistor and a second terminal coupled to the drain of the second MOS transistor;
wherein neither the first MOS transistor nor the second MOS transistor is part of a differential pair in the first or second transimpedance amplifier, respectively.

2. The device according to claim 1, wherein the current source is configured to deliver a bias current to the first MOS transistor and the second MOS transistor.

3. The device according to claim 1, wherein:
the first amplification stage is connected to the output of the first transimpedance amplifier; and the second amplification stage is connected to the output of the second transimpedance amplifier.

4. The device according to claim 3, wherein:
the drain of the first MOS transistor is connected to the output of the first transimpedance amplifier; and
the drain of the second MOS transistor is connected to the output of the second transimpedance amplifier.

5. The device according to claim 1, wherein:
the first amplification stage is coupled to the output of the first transimpedance amplifier by a first gain stage; and
the second amplification stage is coupled to the output of the second transimpedance amplifier by a second gain stage.

6. The device according to claim 5, wherein:
the drain of the first MOS transistor is coupled to the output of the first transimpedance amplifier by the first gain stage; and
the drain of the second MOS transistor is coupled to the output of the second transimpedance amplifier by the second gain stage.

7. The device according to claim 1, wherein the first supply potential is higher than the second supply potential.

8. The device according to claim 7, wherein the first MOS transistor is a p-type MOS (PMOS) transistor, and the second MOS transistor is an n-type MOS (NMOS) transistor.

9. The device according to claim 1, further comprising:
a first photodiode connected to the input of the first transimpedance amplifier; and
a second photodiode connected to the input of the second transimpedance amplifier.

10. The device according to claim 9, wherein the first and second photodiodes are configured to receive light having a same wavelength but with different angles of incidence.

11. The device according to claim 9, wherein the first and second photodiodes are configured to belong to different optical channels.

12. The device according to claim 1, further comprising:
a photodiode connected between the input of the first transimpedance amplifier and the input of the second transimpedance amplifier; and
a capacitive element connected between the input of the first transimpedance amplifier and the first node, or between the input of the second transimpedance amplifier and the second node.

13. The device according to claim 12, further comprising a differential amplifier having a first differential input coupled to the output of the first transimpedance amplifier and a second differential input coupled to the output of the second transimpedance amplifier.

14. A device comprising:
a first transimpedance amplifier comprising:
    a first amplification stage with a first metal-oxide-semiconductor (MOS) transistor, the first MOS transistor having a source connected to a first node configured to receive a first supply potential, a drain coupled to an output of the first transimpedance amplifier, and a gate connected to an input of the first transimpedance amplifier; and
    a first feedback impedance having a first terminal connected to the input of the first transimpedance amplifier and a second terminal connected to the output of the first transimpedance amplifier;
a second transimpedance amplifier comprising:
    a second amplification stage with a second MOS transistor, the second MOS transistor having a source connected to a second node configured to receive a second supply potential, a drain coupled to an output of the second transimpedance amplifier, and a gate connected to an input of the second transimpedance amplifier; and a second feedback impedance having a first terminal connected to the input of the second transimpedance amplifier and a second terminal connected to the output of the second transimpedance amplifier;

a first sensing element having a first terminal connected to the input of the first transimpedance amplifier;

a second sensing element having a second terminal connected to the input of the second transimpedance amplifier; and a current source series-connected with the first and second amplification stages between the first and second nodes, the current source having a first terminal coupled to the drain of the first MOS transistor and a second terminal coupled to the drain of the second MOS transistor, and the current source configured to deliver a bias current to the first MOS transistor and the second MOS transistor;

wherein neither the first MOS transistor nor the second MOS transistor is part of a differential pair in the first or second transimpedance amplifier, respectively.

15. The device according to claim 14, wherein:

the first amplification stage is connected to the output of the first transimpedance amplifier; and the second amplification stage is connected to the output of the second transimpedance amplifier.

16. A device comprising:

a first transimpedance amplifier comprising:

a first amplification stage with a first metal-oxide-semiconductor (MOS) transistor, the first MOS transistor having a source connected to a first node configured to receive a first supply potential, a drain coupled to an output of the first transimpedance amplifier, and a gate connected to an input of the first transimpedance amplifier, wherein the first amplification stage is coupled to the output of the first transimpedance amplifier by a first gain stage; and a first feedback impedance having a first terminal connected to the input of the first transimpedance amplifier and a second terminal connected to the output of the first transimpedance amplifier;

a second transimpedance amplifier comprising:

a second amplification stage with a second MOS transistor, the second MOS transistor having a source connected to a second node configured to receive a second supply potential, a drain coupled to an output of the second transimpedance amplifier, and a gate connected to an input of the second transimpedance amplifier, wherein the second amplification stage is coupled to the output of the second transimpedance amplifier by a second gain stage; and a second feedback impedance having a first terminal connected to the input of the second transimpedance amplifier and a second terminal connected to the output of the second transimpedance amplifier; and a current source series-connected with the first and second amplification stages between the first and second nodes, the current source having a first terminal coupled to the drain of the first MOS transistor and a second terminal coupled to the drain of the second MOS transistor, and the current source configured to deliver a bias current to the first MOS transistor and the second MOS transistor;

wherein neither the first MOS transistor nor the second MOS transistor is part of a differential pair in the first or second transimpedance amplifier, respectively.

17. The device according to claim 16, wherein:

the drain of the first MOS transistor is coupled to the output of the first transimpedance amplifier by the first gain stage; and the drain of the second MOS transistor is coupled to the output of the second transimpedance amplifier by the second gain stage.

18. The device of claim 14, wherein the first sensing element and the second sensing element are a same sensing element, and the same sensing element is a photodiode or a temperature-sensing resistor.

19. The device of claim 14, wherein:

the first sensing element and the second sensing element are different sensing elements;

the first sensing element has a second terminal connected to the first node; and the second sensing element has a first terminal connected to the second node.

20. The device of claim 19, wherein:

the first sensing element and the second sensing element are photodiodes; or the first sensing element and the second sensing element are temperature-sensing resistors.

* * * * *